United States Patent [19]

Hasoon et al.

[11] Patent Number: 5,484,736
[45] Date of Patent: Jan. 16, 1996

[54] PROCESS FOR PRODUCING LARGE GRAIN CADMIUM TELLURIDE

[75] Inventors: Falah S. Hasoon, Arvada; Art J. Nelson, Longmont, both of Colo.

[73] Assignee: Midwest Research Institute, Kansas City, Mo.

[21] Appl. No.: 308,362

[22] Filed: Sep. 19, 1994

[51] Int. Cl.$^6$ .................................... H01L 31/18
[52] U.S. Cl. .............. 437/4; 437/174; 136/260; 148/DIG. 64
[58] Field of Search .................. 136/260; 148/DIG. 64, 148/DIG. 3; 437/174, 4

[56] References Cited

U.S. PATENT DOCUMENTS

| | | |
|---|---|---|
| 3,357,857 | 12/1967 | Provisor et al. . |
| 3,793,069 | 2/1974 | Shimizu et al. ........................ 117/201 |
| 4,207,119 | 6/1980 | Tyan ..................................... 136/89 TF |
| 4,325,986 | 4/1982 | Baron et al. ............................. 427/74 |
| 4,689,427 | 8/1987 | Doty et al. .............................. 136/260 |
| 4,734,381 | 3/1988 | Mitchell ..................................... 437/5 |
| 5,304,499 | 4/1994 | Bonnet et al. ........................... 136/260 |

OTHER PUBLICATIONS

Hsu et al., Conf. Record, 17th IEEE Photovoltaic Specialists Conf., Kissimmee, Fla., May 1–4, 1984, Pub. Oct. 30, 1984.
Menezes et al., Solar Energy Materials, vol. 11, 1985, pp. 401–407.
Chaudhuri et al., Thin Solid Films, vol. 147, 1987, pp. 9–16.

*Primary Examiner*—R. Bruce Breneman
*Assistant Examiner*—Ramamohan Rao
*Attorney, Agent, or Firm*—Edna M. O'Connor

[57] ABSTRACT

A process for producing a cadmium telluride polycrystalline film having grain sizes greater than about 20 μm. The process comprises providing a substrate upon which cadmium telluride can be deposited and placing that substrate within a vacuum chamber containing a cadmium telluride effusion cell. A polycrystalline film is then deposited on the substrate through the steps of evacuating the vacuum chamber to a pressure of at least $10^{-6}$ torr.; heating the effusion cell to a temperature whereat the cell releases stoichiometric amounts of cadmium telluride usable as a molecular beam source for growth of grains on the substrate; heating the substrate to a temperature whereat a stoichiometric film of cadmium telluride can be deposited; and releasing cadmium telluride from the effusion cell for deposition as a film on the substrate. The substrate then is placed in a furnace having an inert gas atmosphere and heated for a sufficient period of time at an annealing temperature whereat cadmium telluride grains on the substrate grow to sizes greater than about 20 μm.

8 Claims, No Drawings

PROCESS FOR PRODUCING LARGE GRAIN CADMIUM TELLURIDE

The United States Government has rights in this invention under Contract No. DE AC 36 83CH10093 between the United States Department of Energy and the National Renewable Energy Laboratory, a division of the Midwest Research Institute.

BACKGROUND OF THE INVENTION

I. Field of the Invention

The present invention relates to a process for producing a cadmium telluride polycrystalline film having grain sizes greater than about 20 µm by first depositing cadmium telluride on a substrate and subsequently exposing the deposited cadmium telluride to an inert gas such as helium at an elevated temperature.

II. Description of the Prior Art

Polycrystalline, thin-film cadmium telluride shows promise for terrestrial photovoltaic applications primarily because of its direct band gap of 1.5 eV, which is optimum for solar energy conversion at air mass 1 (AM1). However, in order to fabricate high-efficiency solar energy collecting devices employing a cadmium telluride film, grain size of the cadmium telluride should be at least greater than 1 µm, with increased efficiency being directly proportional to increased grain size. In particular, greater grain size avoids bulk recombination, large interface state density and high resistivity.

While cadmium sulfide films have been developed with grain sizes up to about 800 µm, cadmium telluride films generally have not exceeded a grain size larger than about 5 µm, with such growth occurring through post-deposition chemical treatment with cadmium chloride. Such small grain sizes and the resultant numerous boundaries of individual crystals critically inhibits the flow of charge carriers through a polycrystalline film.

In view of the potential value in photovoltaic applications for cadmium telluride films having large grain sizes, it is apparent that a need is present for a process for producing large-grain films. Accordingly, a primary object of the present invention is to provide a process for producing a cadmium telluride polycrystalline film having grain sizes greater than about 20 µm.

Another object of the present invention is to provide such a process wherein cadmium telluride is deposited on a substrate by sublimation from a cadmium telluride effusion cell.

Yet another object of the present invention is to provide such a process wherein exposure to an inert gas is employed to enhance grain size development subsequent to cadmium telluride deposition on a substrate.

These and other objects of the present invention will become apparent throughout the description of the invention which now follows.

SUMMARY OF THE INVENTION

The present invention is a process for producing a cadmium telluride polycrystalline film having cadmium telluride grain sizes greater than about 20 µm. The process comprises, first of all, providing a substrate upon which cadmium telluride can be deposited and placing that substrate within a vacuum chamber containing a cadmium telluride effusion cell. A cadmium telluride polycrystalline film is then deposited on the substrate through the steps of evacuating the vacuum chamber to a pressure of at least $10^{-6}$ torr.; heating the effusion cell to a cell temperature whereat the cell releases stoichiometric amounts of cadmium telluride usable as a molecular beam source for growth of cadmium telluride grains on the substrate; heating the substrate to a substrate temperature whereat a stoichiometric film of cadmium telluride can be deposited; and releasing cadmium telluride from the effusion cell for deposition as a film on the substrate to thereby produce a cadmium telluride deposited-substrate. The cadmium telluride deposited-substrate then is heated in an inert gas atmosphere, preferably argon under negative pressure (not less than $10^{-3}$ torr.) or helium, for a sufficient period of time at an annealing temperature whereat cadmium telluride grains on the deposited-substrate grow to sizes greater than about 20 µm.

DETAILED DESCRIPTION OF THE PREFERRED EMBODIMENT

The present invention is a process for producing a cadmium telluride polycrystalline film having cadmium telluride grain sizes greater than about 20 µm, and preferably greater than about 50 µm, without the use of wet chemicals during post-deposition processing. In the Example that follows, which reports the results of numerous polycrystalline cadmium telluride films grown on glass substrates, scanning electron microscopy, cathodluminescence, transmission electron microscopy, x-ray photoemission and photoluminescence lifetime measurements were used to characterize the large-grain polycrystalline thin films.

EXAMPLE

Polycrystalline cadmium telluride films were grown on Corning 7059 glass substrates at temperatures between about 275° C. to 350° C. in a turbomolecular pumped (520 l/s) stainless steel preparation chamber having a base pressure of $5\times10^{-8}$ torr. Pressure during film growth was $\leq 1\times10^{-6}$ torr. In-situ or ex-situ post-deposition processing for enhanced grain growth was performed in argon gas ($10^{-3}$ torr.) or helium gas, respectively, at temperatures $\leq 500°$ C.

A single, water-cooled boron nitride effusion cell provided the source of the deposited cadmium telluride films. Deposition rates showed the typical Arrenhius behavior wherein the deposition rate is linear versus the reciprocal of the absolute source temperature. The observed linear growth rate indicated that the effusion cell released stoichiometric amounts of cadmium telluride in a temperature range of from about 450° C. to about 500° C., and can be used as a molecular beam source for the growth of cadmium telluride. Quantitative compositional analysis, performed with an electron microprobe (EMPA) using x-ray wavelength dispersive spectroscopy (WDS) and x-ray photoemission spectroscopy (XPS) confirmed that deposited films were stoichiometric cadmium telluride.

Film morphology and quality were investigated by scanning electron microscopy (SEM) and cathodluminescence (CL) using a JEOL 840 SEM equipped with a liquid helium-cooled stage. The structures of the resultant films were investigated by cross-sectional transmission electron microscopy (TEM) using a Philips CM30 STEM operating at 300 kV. Specimen preparation for TEM examination included chemical etching, mechanical polishing and ion milling.

Time resolved photoluminescence (TRPL) using standard time correlated photon counting techniques was used to determine carrier lifetimes. The laser source was a Spectra Physics model 350 synchronously-pumped dye laser operating at 4 Mhz and 600 nm, with a 10 ps pulse width. The incident power was 10 mW over an 8 $mm^2$ spot, providing a photon flux of approximately $10^{11}$ photon per $cm^2$ per pulse. Photoexcited carrier densities were estimated at $10^{15}$ $cm^3$, or less. The luminescence photons were collected and focused into a Spex 1762S double subtractive spectrometer with 500 μm slits, providing 20 Å spectral resolution. The spectrometer was set to a wavelength approximately 30 Å longer than the peak in the sample's photoluminescence (PL) spectrum to avoid distortions in the TRPL decay due to carrier diffusion and PL photon re-absorption. Photon detection was accomplished using a Hamamatsu R2809U microchannel plate photomultiplier. System temporal response was approximately 45 ps FWHM. For each TRPL decay measurement a system response curve also was measured. The system response was subsequently convoluted with a analytical model of the PL decay. The convolution of model-with-system response was then fit to the data using a gradient-least-squares search method to find the best-fit parameters for each decay measurement. This convolution method avoids the pitfalls associated with deconvolution of system response from data.

Films were deposited from the effusion cell onto the glass substrate at a substrate temperature of 275° C. at a deposition rate of 50 nm/min. for a total thickness of about 6 μm. Initial grain sizes were on the order of 0.2 μm and were free of defects. Growth of films at substrate temperatures greater than about 300° C. resulted in films with increased defect densities. In addition, all of the as-deposited films were primarily cubic with minimal hexagonal phase as determined by x-ray diffraction, very dense and absent of voids. Post-deposition processing in inert gas for enhanced grain growth did not affect the existing crystal structure or defect density.

Following deposition on the substrate, the films were placed in a tube furnace and annealed in helium at 500° C. for 60 minutes. The films exhibited large, columnar grains, and similar results were obtained for in-situ processing using argon gas at $10^{-3}$ torr., also at 500° C. In both instances, grain size increased over 20-fold and density was preserved. It is believed that the reason for this enhanced grain growth in an inert atmosphere is due to the absence of grain boundary oxides that would otherwise inhibit the coalescence of grains during any post-deposition annealing. The absence of oxide contamination is an inherent characteristic of the present growth technique.

Panchromatic cathodluminescence (CL) photomicrographs of the cadmium telluride films indicated that the films had fairly uniform luminescence properties. All of the grains luminescence to varying degrees, with the highest intensity indicative of a low non-radiative recombination rate which is ideal for photovoltaic material. The CL line scan superimposed on the SEM photomicrograph can be used to determine the recombination efficiency, or loss, within the grains and at grain boundaries, and an average grain boundary loss of 46% was obtained. This means that 46% of the carriers in the vicinity of the grain boundaries will recombine non-radiatively. Recombination efficiencies within the grains are typically in the range of 10–20%, which is indicative of the low intragranular defect densities.

Cadmium telluride films which were subjected to in-situ processing in argon gas ($10^{-3}$ torr.) had typical grain sizes well over 100 μm. It is assumed that these films had less oxide contamination than the films which were transferred to the tube furnace for ex-situ helium processing. The absence of significant grain boundary oxides would account for this dramatic increase in grain size.

High resolution XPS spectra of the Te 4d, Cd 4d and valence band for the as-deposited, argon-annealed films showed an approximate position of the valence band maximum ($E_v$) for these films at 0.6 eV below the Fermi energy ($E_F$), indicating a p-type material. The observed VB features were characteristic of cadmium telluride and correspond to Te and Cd p states. The position of the valence band maximum seems to be unaffected by post-deposition processing with argon or helium within the energy resolution of $\Delta E=1.0$ eV.

Measurements of the binding energy differences of the Te 4d and Cd 4d core lines allows characterization of any possible chemical effects due to the post-deposition processes. The binding energy of the Cd $4d_{5/2}$ spin-orbit component for the as-deposited, argon annealed films was 11.5 eV, which is in agreement with literature values for bulk cadmium telluride. The corresponding binding energy of the Te $4d_{5/2}$ spin-orbit component for the as-deposited and argon annealed films was 40.6 eV, which is also in agreement with literature values for bulk cadmium telluride. Detected small features on the high binding energy side of the Te 4d lines were indicative of $TeO_2$.

TRPL lifetime measurements showed that the as-grown films had minority carrier lifetimes of <40 ps, which represents the limit of system response. TRPL measurements of the large-grain films revealed lifetimes of ≈200 ps which depends strongly on the grain size.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

We claim:

1. A process for producing a cadmium telluride polycrystalline film having cadmium telluride grain sizes greater than about 20 μm, the process comprising:
   a) providing a substrate upon which cadmium telluride can be deposited;
   b) placing the substrate within a vacuum chamber containing a cadmium telluride effusion cell;
   c) depositing a cadmium telluride polycrystalline film on the substrate through the steps of:
      (1) evacuating the vacuum chamber to a pressure of at least $10^{-6}$ torr.;
      (2) heating the effusion cell to a cell temperature whereat the cell releases stoichiometric amounts of cadmium telluride usable as a molecular beam source for growth of cadmium telluride grains on the substrate;
      (3) heating the substrate to a substrate temperature whereat a stoichiometric film of cadmium telluride can be deposited; and
      (4) releasing cadmium telluride from the effusion cell and depositing said cadmium telluride as a film on the substrate to thereby produce a cadmium telluride deposited-substrate; and
   d) heating the cadmium telluride deposited-substrate in an inert gas atmosphere for a sufficient period of time at an annealing temperature whereat cadmium telluride grains on the deposited-substrate grow to sizes greater than about 20 μm.

2. A process as claimed in claim 1 wherein the substrate is glass.

3. A process as claimed in claim 2 wherein the cell temperature is from about 450° C. to about 500° C.

4. A process as claimed in claim 3 wherein the substrate temperature is from about 250° C. to about 300° C.

5. A process as claimed in claim 4 wherein the inert gas is helium.

6. A process as claimed in claim 5 wherein the annealing temperature is from about 450° C. to about 500° C.

7. A process as claimed in claim 4 wherein the inert gas is argon at a pressure of about $10^{-3}$ torr.

8. A process as claimed in claim 7 wherein the annealing temperature is from about 450° C. to about 500° C.

* * * * *